United States Patent
Bosak, III et al.

(10) Patent No.: US 6,507,981 B1
(45) Date of Patent: Jan. 21, 2003

(54) FASTENER CARRIER

(75) Inventors: Henry C. Bosak, III, Hillsboro, OR (US); Geoffrey B. Ford, Beaverton, OR (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/718,869

(22) Filed: Nov. 20, 2000

(51) Int. Cl.[7] .......................... H05K 7/20; F16B 13/00; F16B 19/00; A44B 21/00
(52) U.S. Cl. .......................... 24/457; 24/458; 361/704; 174/16.3; 165/80.3
(58) Field of Search .................. 24/457, 458; 174/16.3; 361/704; 411/442; 257/718

(56) References Cited

U.S. PATENT DOCUMENTS

| | | | |
|---|---|---|---|
| 4,009,423 A | * 2/1977 | Wilson | 165/80.3 |
| 4,660,123 A | 4/1987 | Hermann | |
| 4,745,456 A | 5/1988 | Clemens | |
| 5,384,940 A | * 1/1995 | Soule et al. | 24/453 |
| 5,509,768 A | 4/1996 | Hon | |
| 5,522,687 A | 6/1996 | Chen | |
| 5,594,624 A | 1/1997 | Clemens et al. | |
| 5,622,024 A | 4/1997 | Habermehl | |
| 5,640,305 A | 6/1997 | Smithers | |
| 5,713,709 A | 2/1998 | Huang | |
| 5,847,928 A | 12/1998 | Hinshaw et al. | |
| 5,901,039 A | * 5/1999 | Dehaine et al. | 361/704 |
| 6,071,128 A | 6/2000 | Brewington et al. | |
| 6,105,215 A | * 8/2000 | Lee | 24/458 |
| 6,301,113 B1 | * 10/2001 | Guerrero | 361/704 |
| 6,307,748 B1 | * 10/2001 | Lin et al. | 361/704 |
| 6,317,328 B1 | * 11/2001 | Su | 361/704 |
| 6,331,937 B1 | * 12/2001 | Bartyzel | 361/687 |
| 6,374,906 B1 | * 4/2002 | Peterson et al. | 165/80.3 |

FOREIGN PATENT DOCUMENTS

| | | |
|---|---|---|
| DE | 19844627 | 9/1998 |
| JP | 06-310807 | 11/1994 |

OTHER PUBLICATIONS

Davidge et al., "Bridge Assembly for Mounting Interchangeable Electromagnetic Devices", IBM Publication No. TDB 02–87, pp. 4117–4118 (Feb. 1987).

Shi et al., "Cleaning Method and Apparatus", IBM Publication No. TDB 01–86, pp. 3715–3716 (Jan. 1986).

* cited by examiner

*Primary Examiner*—Robert J. Sandy
(74) *Attorney, Agent, or Firm*—Dilworth Paxson LLP; Pryor A. Garnett; Lieberman & Brandsdorfer LLC

(57) ABSTRACT

A flexible/foldable fastener carrier, comprising one or more captive fasteners inserted at predetermined positions on the carrier. The positions correspond to fastening points on a separate article being secured by the fastener, permitting the each fastener to align with the fastening point on the article when the carrier is placed on or around the article. Because the fasteners remain captive in the fastener carrier, they cannot be lost or inadvertently dropped into the device to which the article is being secured. After the article has been secured, the fastener carrier is retained in place for use if the article is removed or replaced, or the carrier is removed from the article without disturbing either the secure article or the fasteners.

10 Claims, 5 Drawing Sheets

FASTENER CARRIER

BACKGROUND OF THE INVENTION

1. Technical Field

This invention relates to a fastener carrier assembly that retains at least one fastener and is used to deliver the fastener(s) to predetermined location(s) on an article, thereby permitting the article to be secured by the fastener(s), particularly in or on an electronic device.

2. Description of the Prior Art

Microprocessors and integrated circuit components are becoming highly complex, with a steady progression toward larger devices to permit the inclusion of a greater number of functions on each device. Consequently, additional accessories and components are being added to accommodate the increased functions.

A parallel development in the assembly art has been the advancement of means for securing articles, accessories and components, particularly to expensive integrated circuit devices and to circuit boards. Permanent attachment, e.g., by adhesives or solder, is unacceptable because the malfunction, failure, or simply an upgrade, of a single component, such as a chip, could necessitate disposal of the entire unit to which it is attached. At the very least, semi-permanent attachment, such as by solder, although it can be melted, makes replacing defective parts time-consuming and difficult, with a high risk of damage to the unit, e.g. a circuit board, during the replacement process. In addition, large electronic assemblies, such as semiconductor devices, generate a substantial amount of heat, which makes ineffective the use of standard adhesives and non-mechanical means of attachment.

A number of arrangements of springs, clips, mounting straps, and anchoring devices, such as those shown in U.S. Pat. No. 4,745,456 (Clemens), U.S. Pat. No. 4,660,123 (Herman), U.S. Pat. No. 5,594,624 (Clemens), U.S. Pat. No. 5,640,305 (Smithers), U.S. Pat. No. 5,847,928 (Hinshaw), as well as pin/socket arrays have been used in an attempt to removeably attach or secure articles, accessories or components to electronic devices. However, such arrangements have proven problematic because the articles, accessories and components become loose or detached, particularly in response to shock, vibration or heat. Moreover, circuit boards and otherwise flat components, when subjected to the compression or bending stresses generated by the spring or clip assemblies used to secure attachments, have been disadvantageously shown to warp.

The use of fasteners, such as screws, for securing articles, electronic components or sub-assemblies together, or to anchor electronic devices to circuit boards, is also often problematic. For example, an assembler or technician who has to install components that have to be mounted upside-down, must simultaneously hold both the component and the fastener in place while mounting the component. Consequently, fasteners are often dropped and lost during the installation process or servicing, which becomes not only an inconvenience, but if the fastener falls into the electronic device and is not removed, it could eventually damage the system.

Intel supplies a fastening system for attaching an article within the microprocessor module called a power pod, but it merely provides holes into which loose screws may be inserted. Although "captive" screws may be used to attach the processor heatsink, no solution is evident for attaching the power pod or other components by a fastener means which is not at risk of inadvertently being dropped into the system or lost when the pods or other components are changed or removed.

Therefore, there has remained, until the present invention, a long-felt need for a method or apparatus that would permit individual articles, accessories or components to be easily and efficiently added or removed from a device without risk of dropping and losing mounting fasteners used to secure such articles and the like in place. Moreover, even outside of the electronics and computer industry, there also has remained a need to inspect and confirm the proper placement of fasteners in devices, particularly in difficult to view locations in which correct placement of the attached component and the fasteners holding it are critical to the proper function of the combined assembly.

SUMMARY OF THE INVENTION

This invention comprises a fastener carrier that fits either over or around an article, accessory or component and contains at least one captive fastener used to hold the article, accessory or component in place.

A preferred embodiment of the invention provides a fastener carrier comprising a body having at least one predetermined fastener location, and at least one captive fastener inserted at each fastener location. In particular, there is provided the fastener carrier in which a position of each predetermined fastener location is determined by a corresponding position of a fastening point on an article being secured by the fastener(s). Moreover, the fastener carrier is provided, wherein the body is made from a bendable, foldable sheet of a material selected from the group consisting of metals, plastics, polypropylene, polymers, papers, pressed fibers, elastomeric materials, pressed fibers containing webs or strips of plastics or polymers, and combinations thereof. In certain embodiments of the invention, the body is created from thermally sensitive materials, including heat resistant material or heat-conductive material.

Further provided is a method for making a fastener carrier comprising creating a body for the fastener carrier that will fit an article, creating at least one fastener position in the body that aligns with a predetermined fastening point on the article being secured by the fastener(s), and inserting a fastener into each fastener position so that the fastener is held captive in the carrier at that position.

Also provided is a method for securing an article using the aforementioned fastener carrier comprising securing the article by means of the at least one captive fastener. In one embodiment the method is provided, wherein each fastener remains in place in the fastener carrier after the article is secured. In another embodiment the method is provided, wherein after the article is secured, the fastener carrier is removed from the article without disturbing the secured article or the fastener(s). In yet another embodiment the method is provided, wherein the body of the carrier further comprises a lightweight adhesive coating on the surface of the carrier facing the article being secured.

Other features and advantages of this invention will become apparent from the following detailed description of the presently preferred embodiment of the invention, taken in conjunction with-the accompanying drawings.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown.

DESCRIPTION OF THE PREFERRED EMBODIMENT

Overview

Figure 1:
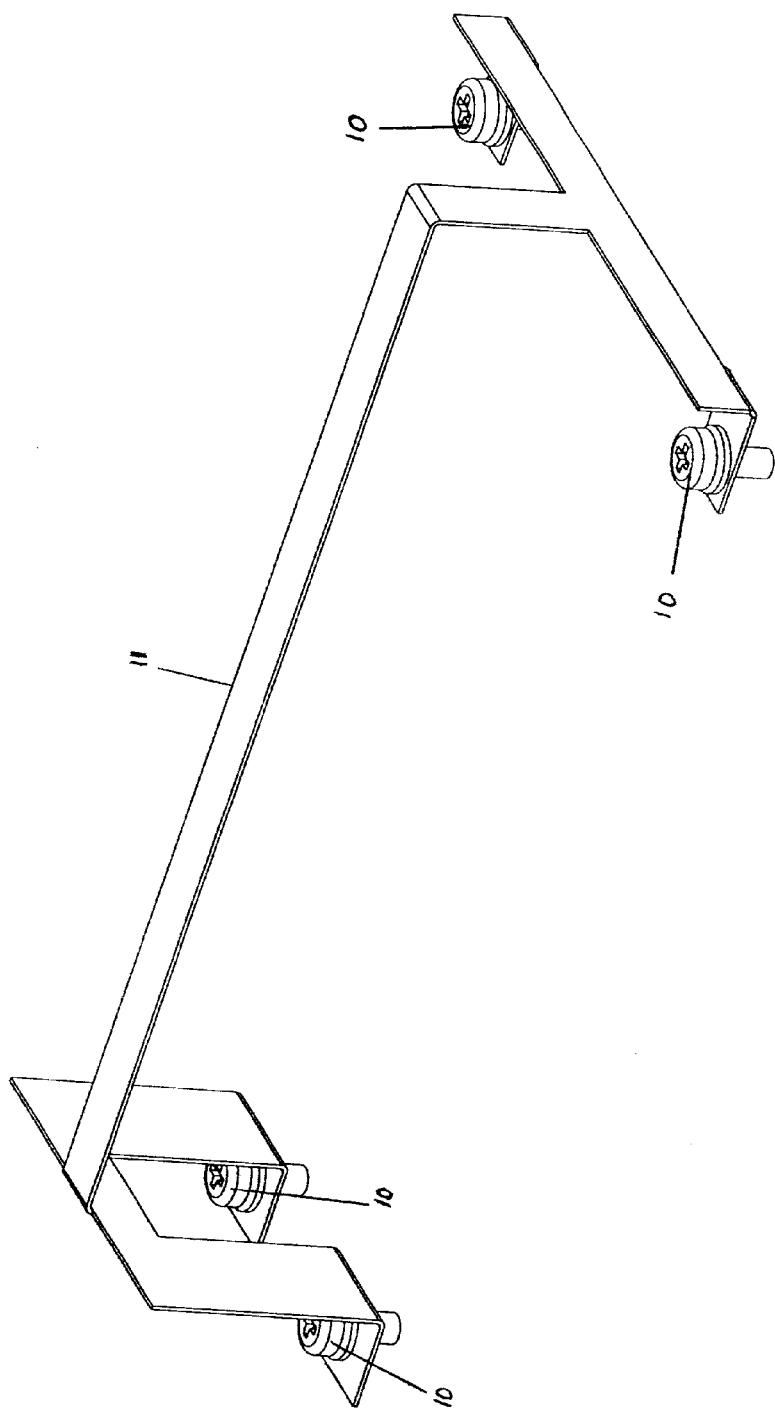
FIG. 1 is a diagram of a fastener carrier according to the preferred embodiment of this invention, and is suggested for printing on the first page of the issued patent.

The preferred embodiment of the present invention comprises a fastener carrier assembly that fits either over or around an article, accessory or component, and contains at least one captive fastener used to secure the article, accessory or component, particularly in or on an electronic device. However, the fastener carrier is not limited to applications in the electronics or computer industry, but finds many uses to efficiently deliver one or more captive fasteners, which cannot be lost or dropped from the carrier, particularly in difficult to view locations in which correct placement of the attached component and the fastener(s) holding it are critical to the proper function of the device.

Technical Background

The fastener carrier provided in the present invention is a thin, flexible, bendable or foldable sheet having at least one fastener permanently inserted through the carrier in a predetermined position, such that the head of the fastener (which has a shank, a head end, and an opposite distal end, referred to as the pointed end) remains on the outer side of the carrier sheet and flush therewith. The opposite end of the fastener, having been inserted perpendicularly through the carrier sheet, projects and is held at a right angle to the sheet pointing toward the article, accessory or component (referred to collectively, simply as an "article"), to be held in place by the fastener when the fastener is put into use to secure such article to, for example, an electrical device.

In a preferred embodiment of the invention, the fastener is a screw of a size and shape designed to fit the article being secured. The number of fasteners carried by the fastener carrier is not limited by the carrier, rather the number is determined by the number of fasteners required to secure the article. Each fastener is inserted into the article at a predetermined position.

The location of the fastener on the fastener carrier corresponds, when the sheet is placed over or around a separate article, to a hole or other fastening point (the predetermined position) on the article being secured to or within the device. Thus, the location(s) of the fastener(s) on the carrier are also predetermined. The sheet retains each fastener in place at the predetermined location, thereby preventing the fastener from detaching, dropping or becoming lost. The carrier sheet remains in place at least until the article has been fastened or secured, for example to an electronic device, processor or circuit board. Thus, the invention generically provides a carrier for holding captive fasteners in place for use with an article that does not have a built-in fastener retainer means for preventing the fastener (s) from becoming separated or dropping until such time as the article can be secured.

The retention mechanisms for holding the fastener(s) captive within the fastener carrier can utilize any retention mechanism known in the art, and the invention is not limited to any one mechanism. For example, a number of locking mechanisms are known in the art for engaging and retaining fasteners, particularly screws, in the fastener carrier, involving combinations of notches, edges, teeth, flanges, clamps, stays and the like. See, e.g., U.S. Pat. No. 5,509,768 (Hon), U.S. Pat. No. 5,522,687 (Chen), and U.S. Pat. No. 5,713,709 (Huang), each of which is herein incorporated by reference.

Moreover, the fastener retention means may be made of the same material as the carrier itself, or it may be made of a different material. For example, the carrier may be metal, but the teeth or edge holding the fastener captive may be plastic. If the fastener is a screw, in one embodiment the screw threads engage the edges of the fastener hole in the carrier. Regardless of the fastener retention means used, however, each fastener is securely retained in the fastener carrier, and the fastener cannot inadvertently fall from the carrier. However, if desired, the fastener can easily be removed from the carrier by the practitioner.

The fastener(s) carried by the fastener carrier of the present invention may be secured by any known means including a variety of power tools. For example, if the fastener(s) are screws, then power drills and screwdrivers may be used, with or without human intervention, or the screws can be tightened manually. The fastener head can be of any type, and the carrier may be adapted specifically for the head of the fastener (i.e., the location of the fastener on the carrier may be depressed on its outer surface to permit the fastener to be countersunk into the carrier), or not, according to need, and as would be recognized by one skilled in the art.

In one embodiment, the carrier of the present invention is applied to a separate article, thereby carrying to such article, the fastener(s) for securing the article. Therefore, use of the invention eliminates the need for fastener-retaining means to be built into the article itself.

In another embodiment, the carrier of the present invention is made from material with specific thermal properties, which permits the carrier to be used in relatively hot environments, such as when the electrical device to which an article is secured or fastened to a heat producing device, such as a power supply or microprocessor. The material in one embodiment is heat-resistant, while in another it is heat-conductive, depending on the function it is designed to perform in addition to simply carrying the fastener to the device.

Referring to the drawings FIG. 1 shows the fastener carrier of the present invention. As shown, the carrier comprises one of a number of thin, flexible, foldable, or bendable materials. Examples of such materials include, but are not limited to, metals which can be shaped or bent into the appropriate sheets, e.g., stainless steel, aluminum, titanium or the like, or any recognized sheet metal; or fabric, tape, paper or pressed fiber material or the like, which may further comprise a mesh or stripes of, e.g., plastic, to prevent inadvertent tearing of the sheet or to reinforce the fold; or plastics or polymers, such as polypropylene, polyester film or elastomeric materials, such as rubber, silicon, polymeric materials or the like, or combinations including any of the aforementioned materials which can be formed into thin sheets.

The body of the carrier 11 is bent and/or shaped to fit either over or around the article, such that when the one or more fasteners, carried into place by the fastener carrier, are tightened, the article is securely held in place on the device to which it is being added. As previously noted, the location of each fastener 10 on the fastener carrier is predetermined by the location of the matching fastening position on the article being secured. Depending upon the material used for the carrier, the fastener is inserted into a guide hole in the carrier, e.g., if made of metal, or it is screwed or driven directly through the intact carrier sheet at the predetermined point, e.g., if the sheet is made of a soft material, such as plastic. Alternately, multiple fasteners may be applied through a combination of guide holes and directly driven. If the fastener carrier comprises guide holes, not all such holes must be filled with fasteners, rather only those holes needed to match the predetermined locations on the article must be filled.

Moreover, each fastener is permanently captured on the fastener carrier ("captive fastener"), which allows the one or more fasteners 10 to be transported to the article as a single unit from which nothing will be lost. Although there may be a plurality of fasteners carried by the fastener carrier, all can be handled by an operator by one hand, since none of the fasteners can fall out. This frees the operator's other hand to actually secure the fasteners to the article, or to secure the article with fasteners in place to the device to which it is to be attached. After the article is secured, the fastener carrier can either remain with the article, or be removed from the article.

Figure 2:
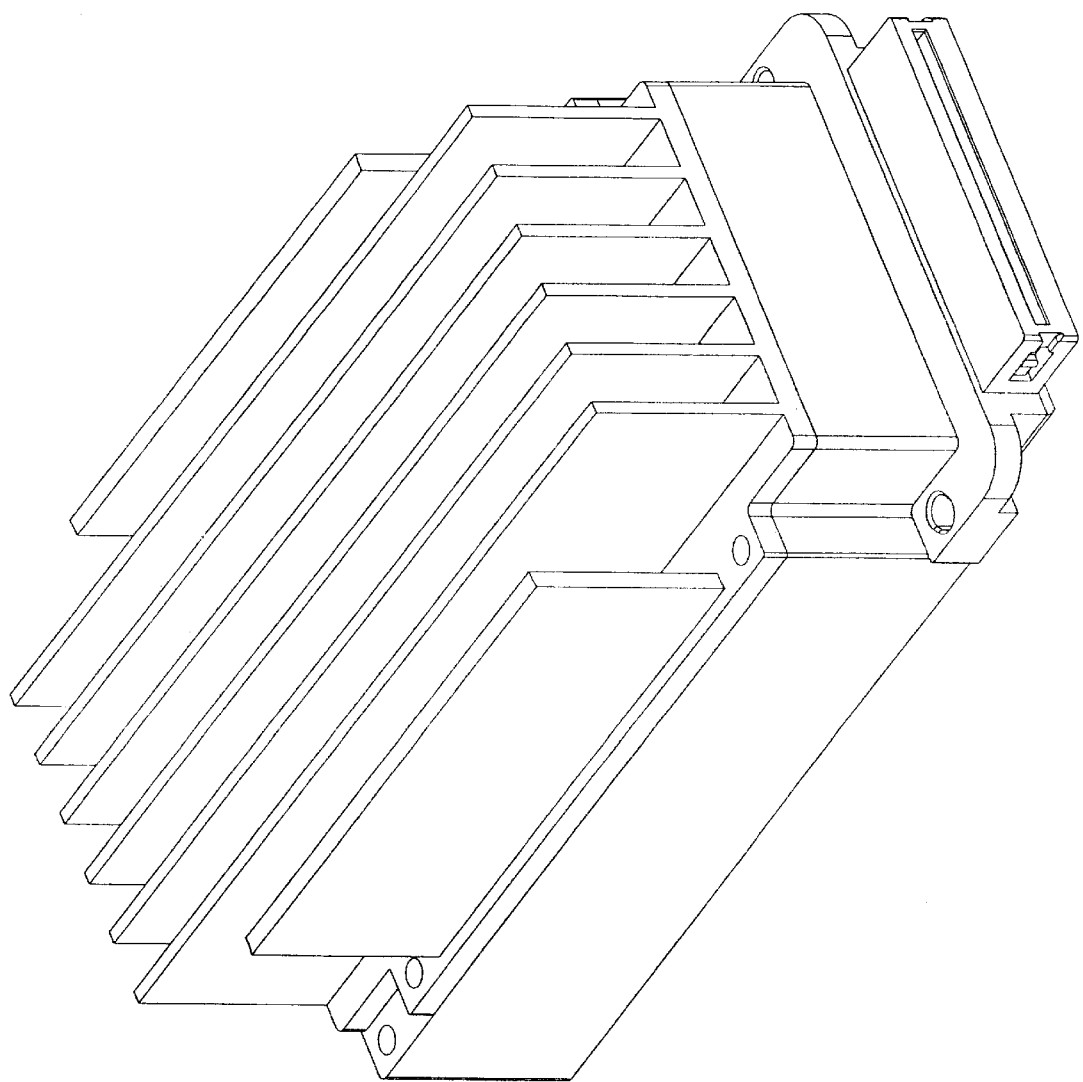
FIG. 2 is an example of an article to be fastened.

FIG. 2 is a drawing showing an example of an article that would utilize the present invention. In this example, the article is a power supply.

Figure 3:
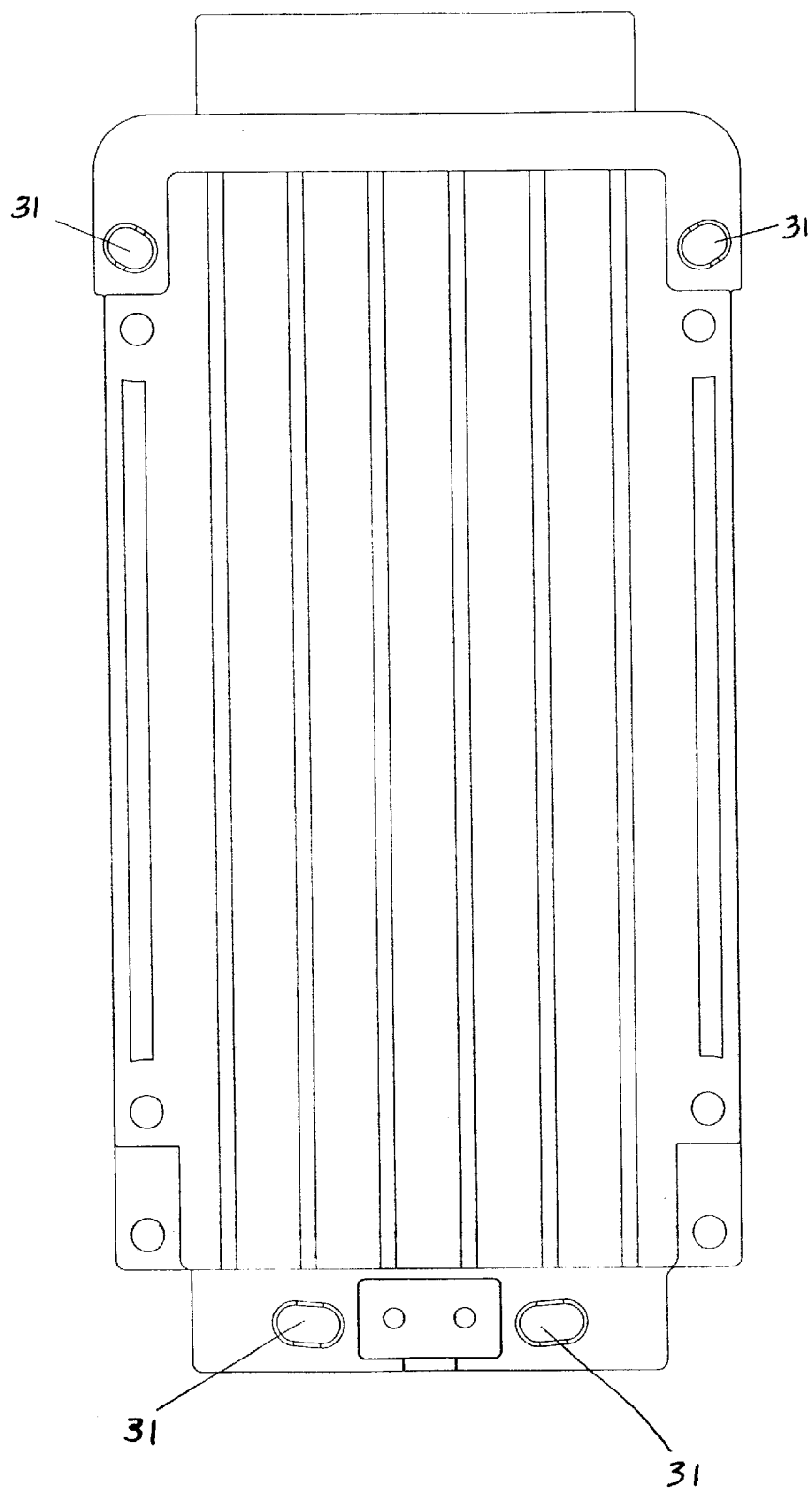
FIG. 3 is a top view of the article to be fastened.

FIG. 3 is a top assembly drawing of the same article as shown in FIG. 2. The article has predetermined fastening positions 31 that are used to secure the article, and that are also used to identify the predetermined location for each fastener carried by the fastener carrier.

Figure 4:
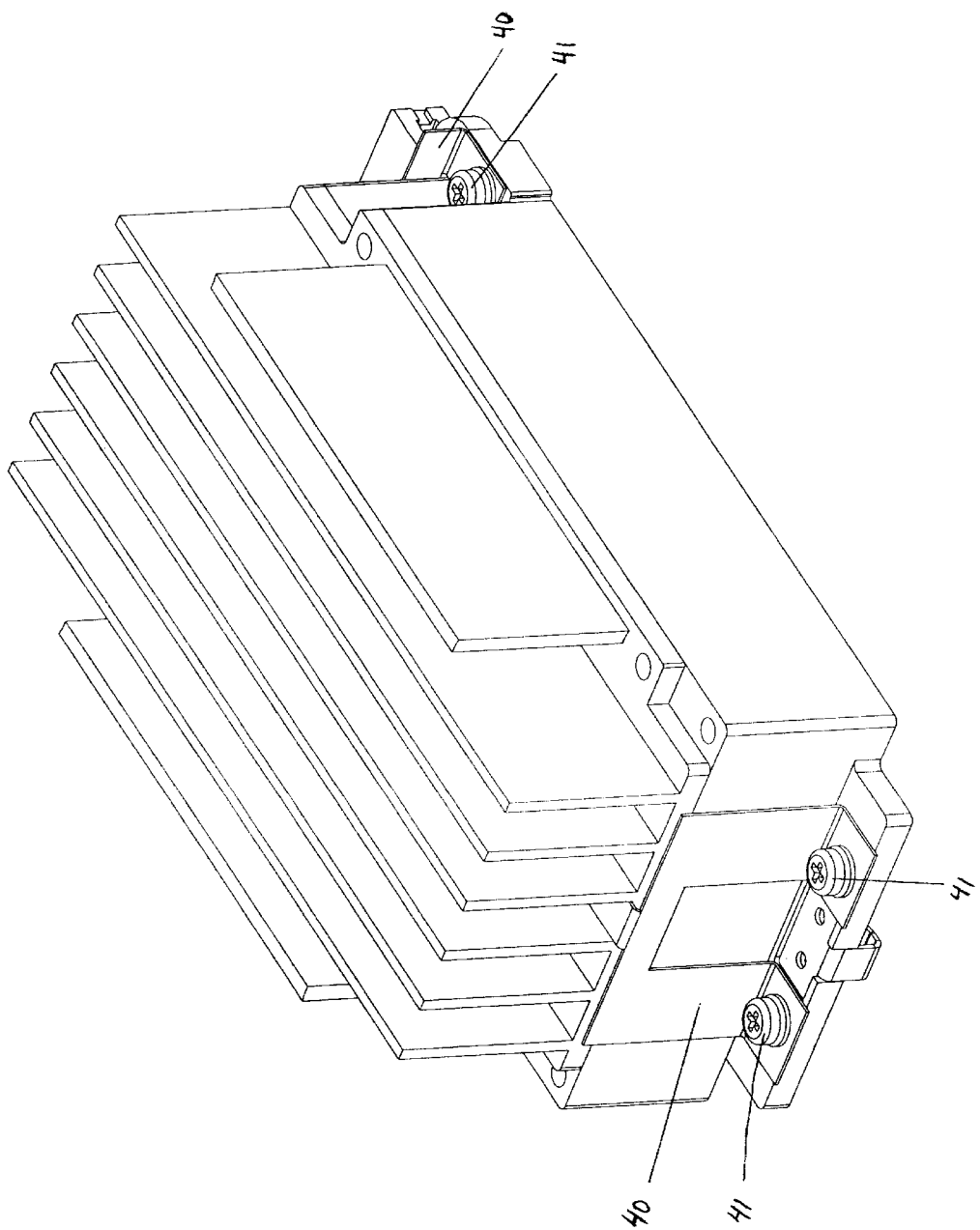
FIGS. 4–5 show how the fastener carrier of FIG. 1 fits the article of FIGS. 2–3.
Figure 5:
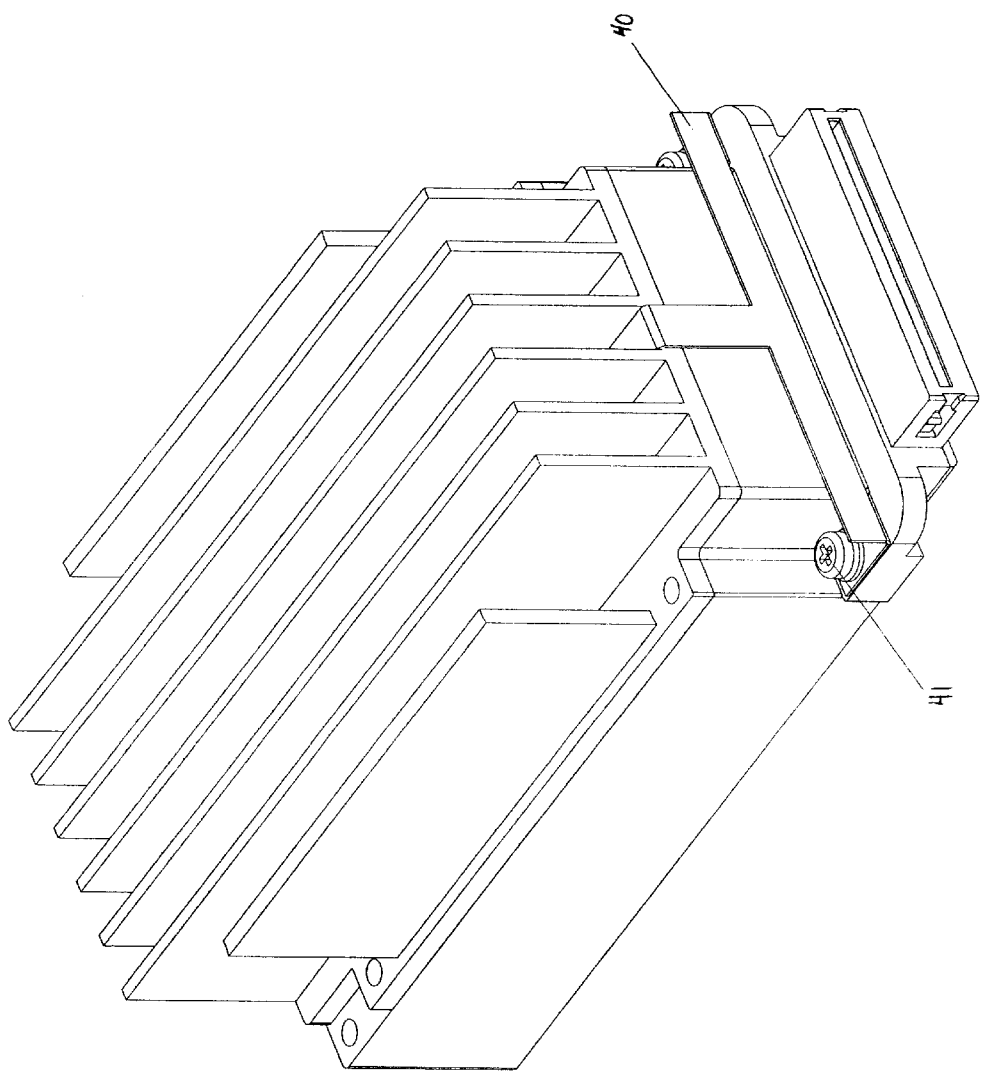

FIGS. 4 and 5 show how the fastener carrier 40 fits an article by fitting around at least a portion of the article, and how the fasteners 41 are attached to the article.

As shown in FIGS. 4 and 5, the fastener carrier is particularly useful for attaching fasteners 41 to the opposite side of the article. Because (i) each fastener is located at the necessary predetermined location for the particular article to which it is to be attached, (ii) each fastener is perpendicular to, or at a predetermined angle to, the carrier to permit the fastener to properly enter the article at the predetermined location, and (iii) each fastener is held captive so that it cannot inadvertently fill or drop from the carrier into the device to which the article is being secured, the fastener(s) can be delivered to secure the article, even to areas in or on the device which cannot be seen. Simply placing the article in place and feeling the fastener in the fastener carrier permits each fastener to be tightened to secure the article, even if it cannot be seen, since each fastener is necessarily in the proper location if the fastener carrier has been aligned with the article. Moreover, because each fastener has thus been secured at its proper location when the fastener carrier of the present invention has been used, quality control is assured even if the fasteners themselves cannot be visually inspected.

In one embodiment of the invention, the fastener carrier is coated, at least in part, on the side of the carrier that faces the article to which it is to be attached, with a lightweight adhesive. By a lightweight adhesive is meant an adhesive which will temporarily hold the fastener carrier in place on or around the article, but which permits the carrier to be pulled away and/or replaced on or around the article, as desired. Use of this embodiment permits the fastener carrier to be placed on or around the article, so that each fastener is aligned at its predetermined location on the article, and the adhesive will hold the carrier, and in fact the fastener(s), in the proper and predetermined location while or until the fastener(s) are tightened, and the article is secured.

When in use, the fastener carrier of the preferred embodiment will remain in place with the fastener(s) retained therein, even after each fastener is fixed to the article and the article is secured. Thus, if the article requires replacement or it must be moved, the fastener(s) can easily be loosened or removed from the article without risk of dropping or losing the fastener(s) into the device since the fastener(s) remain captive in the carrier. Moreover, the fastener(s) remain at the predetermined location for reattaching the article or for attaching its replacement. The fastener carrier, and the fastener(s) attached thereto can be reused any number of times.

Advantages Over the Prior Art

As pointed out above, the fastener carrier of the present invention assures proper placement of the captive fastener(s) needed to secure an article, even if the fastener is being inserted at a location which cannot be seen. Moreover, because each fastener is held captive within the fastener carrier, the fastener cannot be inadvertently lost, or dropped into the device to which the article is being secured, preventing possible damage to the device. The carrier is designed to meet the needs of the article being secured, e.g., (i) it may be made of a material permitting it to remain in place on or around the article, permitting replacement of the article and reuse of the fastener(s) in the carrier, (ii) it may be removable to avoid interference with the operation of the article or the device to which it has been secured, and (iii) it may have additional attributes, such as a lightweight adhesive permitting it to be temporarily held in place by itself until the article can be secured, freeing the practitioner's hands for other functions, or an elastic quality permitting vibrations to be absorbed.

Many other advantages and attributes will be readily apparent from a careful reading of the description herein provided and from the actual practice of the invention.

Each and every patent, patent application and publication that is cited in the foregoing specification is herein incorporated by reference in its entirety.

Alternative Embodiments

It will be appreciated that, although specific embodiments of the invention have been described herein for purposes of illustration, it will be apparent to those skilled in the art that the invention may be subject to various modifications may be made without departing from the spirit and scope of the invention. As described, the present invention is made to fit either over or around an article, embodiments use many different types of fasteners, although in a preferred embodiment the fastener is a screw, and the fastener carrier is made of a variety of materials dictated by the intended application and the article being secured.

The fastener carrier material can also act as a washer to reduce sound or other vibrations, or as a gasket or sealant around the fastener itself.

In another embodiment, the carrier is comprised of a particularly lightweight material, such as a heavy paper or lightweight plastic, i.e., polypropylene or mylar, permitting the carrier material to be easily torn away and discarded after each fastener is fixed to ;the article and the article secured. Once the fastener carrier has served its purpose of carrying the fasteners to the article and locating each fastener at its predetermined location, removal of the carrier prevents it from interfering with the proper operation of the device. Tearing of the fastener carrier in this embodiment may be facilitated by preexisting score lines.

Accordingly, the foregoing description is provided only by way of example, equivalent variations and additional embodiments are also intended to fall within the scope of the appended claims, and the scope of protection of this invention is limited only by the following claims and their equivalents.

We claim:

1. A fastener carrier comprising:

a body having at least one predetermined fastener location;

at least one captive fastener held at each fastener location prior to actuation of said fastener;

wherein a position of each predetermined fastener location is determined by a corresponding position of a fastening point on an article adapted to be secured by said fastener; and wherein said body is comprised of a material selected from the group consisting of: polyester film, plastic, polypropylene, polymer, paper, elastomeric, pressed fiber, pressed fiber containing webs or strips of plastics or polymers, and combinations thereof.

2. The fastener carrier of claim 1, wherein said body is comprised of a material having a property selected from the group consisting of: bendable and foldable, and combinations thereof.

3. The fastener carrier of claim 2, wherein said body is comprised of a heat-resistant material.

4. The fastener carrier of claim 2, wherein said body is comprised of a heat-conductive material.

5. The fastener carrier of claim 1, wherein the fastener carrier fits over the article.

6. The fastener carrier of claim 1, wherein the fastener carrier fits around the article.

7. The fastener carrier of claim 1, wherein each fastener remains in place in the body after the article is secured.

8. The fastener carrier of claim 1, wherein said body is adapted to be removed from the article without disturbing the secured article or the fastener(s).

9. The fastener carrier of claim 1, wherein said body is adapted to be removed from said fastener subsequent to securing said fastener to said article without disturbing said article.

10. The fastener carrier of claim 1, wherein said body is adapted to receive an adhesive coating on a surface of said carrier adapted to be placed adjacent to said article being secured.

* * * * *